United States Patent

Endo

[15] 3,648,364

[45] Mar. 14, 1972

[54] METHOD OF MAKING A PRINTED RESISTOR

[72] Inventor: Tsunehiko Endo, Tokyo, Japan

[73] Assignee: Hokuriku Electric Industry Co., Ltd., Toyama-Prefecture, Japan

[22] Filed: Apr. 30, 1970

[21] Appl. No.: 33,438

[52] U.S. Cl. ....................29/620, 29/621, 29/628, 338/308, 338/312

[51] Int. Cl. ....................H01c 7/00, H01c 17/00

[58] Field of Search....................29/621, 625, 610, 620, 628; 338/312, 308, 306, 307; 174/68.5

[56] References Cited

UNITED STATES PATENTS

| | | | |
|---|---|---|---|
| 2,848,359 | 8/1958 | Talmey | 117/5.5 X |
| 3,061,911 | 11/1962 | Baker | 338/307 X |
| 3,117,298 | 1/1964 | Grunwald | 338/312 |
| 3,134,085 | 5/1964 | Miller et al. | 338/312 X |
| 3,277,232 | 10/1966 | Ragan | 338/312 X |
| 3,409,856 | 11/1968 | Meoni | 338/312 |
| 3,411,947 | 11/1968 | Block et al. | 338/308 X |

*Primary Examiner*—John F. Campbell
*Assistant Examiner*—Victor A. Di Palma
*Attorney*—Woodling, Krost, Granger and Rust

[57] ABSTRACT

A printed resistor comprising an insulating matrix board, copper layers printed on one side of said board by etching and having predetermined patterns, impedance layers screen printed on the other side of said board, and conductors applied in holes formed in said board and extending through said holes for electrically connecting between selected ones of said copper layers and said impedance layers and the process for producing said printed resistor.

17 Claims, 4 Drawing Figures

METHOD OF MAKING A PRINTED RESISTOR

BACKGROUND OF THE INVENTION

For assembling electronic appliances such as radio sets and television sets, for example, into a compact construction, electric resistors, electric condensers or semiconductors such as transistors are generally attached to a printed circuit board. However, hithertofore, the resistors, condensers or semiconductors have been individually fabricated as independent units and then attached to the printed circuit board by extending the leads of the resistors, condensers or semiconductors through holes in the board for connecting the leads to copper layers on the board by soldering. When the above-mentioned electric appliances are produced in the manner mentioned just above, it is necessary that such devices be attached to the board extending upwardly on the surface of the board by a substantial height, and accordingly, such electric devices are installed occupying a substantial area which imposes restriction on the reduction of the size of such appliances. And generally, installing and soldering such devices on the board requires a substantially long time interval.

SUMMARY OF THE INVENTION

This invention relates to an electric resistor and more particularly, to an electric resistor which is suitably attached to the printed circuit board for various types of electronic appliances.

One principal object of the present invention is to provide a process for producing a printed resistor which makes it possible to reduce the size of an electronic appliance in conjunction with which said resistor is employed and which can be attached to the printed board of the electronic appliance at a height as low as possible from the surface of the board.

For achieving this object of the present invention, the board may be designed to have any other electronic component or components disposed over the printed resistor.

A further object of the present invention is to provide a printed resistor produced by the process as mentioned above.

According to one aspect of the present invention, there is provided a process for producing a printed resistor which comprises the steps of applying copper patterns on a first side of an insulating board by etching so as to form copper layers thereon; forming pairs of aligned through holes in said board and copper layers at points where electrical devices are to be connected; applying a pair of electrical conductors in each of said through holes; and applying impedance material on a second side of said board by printing so as to form layers of impedance material across each pair of said electrical conductors.

According to another aspect of the present invention, there is provided a printed resistor employing a printed circuit board which comprises an insulating board, copper layers printed on a first side of said board by etching and having predetermined patterns, impedance layers printed on a second side of said board at predetermined regions thereon, and conductors applied in holes in said board for electrically connecting between selected ones of said copper layers and said impedance layers.

The above and other objects and attendant advantages of the present invention will be more apparent to those skilled in the art from a reading of the following detailed description in conjunction with the accompanying drawing in which one preferred embodiment of electrical printed resistor according to the present invention is illustrated.

PREFERRED EMBODIMENT OF THE INVENTION

Figure 1:
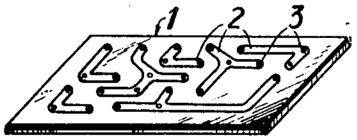
FIG. 1 is a perspective view of a printed circuit board employed in the production of an electric printed resistor according to the present invention showing the side which bears copper patterns thereon.
Figure 2:
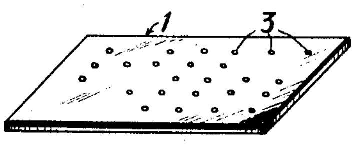
FIG. 2 is a perspective view of said printed circuit board of FIG. 1 showing the opposite side or the side which bears no copper patterns.
Figure 4:
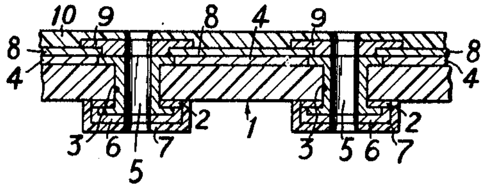
FIG. 4 is a vertically sectional view on an enlarged scale of a portion of a printed resistor provided on said printed circuit board constructed in accordance with the present invention.
Figure 3:
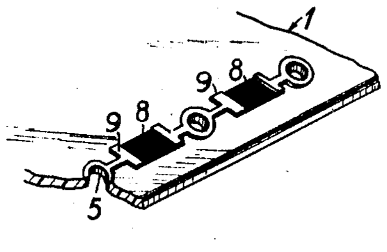
FIG. 3 is a fragmentary perspective view of said printed circuit board having impedance elements printed on said opposite side and electrically connected to the copper layers on said copper pattern-bearing side.

The present invention will be now described referring to the accompanying drawing and more particularly, to FIGS. 1 and 2 thereof. In these figures, a printed circuit board on which a printed resistor is to be provided is generally indicated by reference numeral 1. In the production of an electric printed resistor using the printed circuit board 1 as its matrix body a board formed of a suitable insulating material is formed on one side with copper layers 2 having predetermined patterns by etching away undesired portions of the copper and the board is suitably provided adjacent to the opposite ends of each of said copper layers thereof with through holes 3 also extending the full depth or height of the copper layer.

The thus treated board is then formed on the other side with resin coatings 4 at selected or predetermined areas thereof by screen printing where a resistor is to be applied in the manner which will be described hereinafter. The resin coatings 4 are adapted to eliminate effects upon impedance elements to be formed on the board on the above-mentioned other side depending upon the material of which the board is formed and serve as dampproofing base layers for the impedance elements. The resin coatings 4 may be formed of a solvent-dispersed resin comprising epoxy resin, xylene resin, phenolic resin and melamine resin dispersed in a suitable solvent. The thus printed and coated board is left to dry at the ambient temperature and then subjected to heat treatment at 100°–150° C. for 30 minutes so that the resin layers 4 will be baked. The resin layers may be eliminated in some cases wherein the board has a smooth surface.

Thereafter, the walls defining the holes 3 in selected ones of the copper layers 2 are applied with electrically conductive coatings 5 thereon. Each of the electrically conductive coatings 5 can be applied on the hole defining walls by inserting a small diameter pin on which the conductive coating material is deposited into the hole and then withdrawing the pin out of the hole. The electric conductive layer 5 extends over the adjacent copper layer 2 at one end of the associated hole 3 and over the adjacent resin layer 4 at the other end of the same hole. The electrically conductive coatings 5 comprises a resin dispersion in which a mixture of silver powder and resin such as epoxy resin or phenolic resin is dispersed in a suitable solvent. The electrically conductive layers 5 are then left to dry at the ambient temperature. Conductors which will extend through the electrically conductive coating applied holes 3 may be in the form of conductive rods which will extend through the holes. The copper layer side of the printed board is then applied with second electrically conductive coatings 6 thereon by screen printing at areas where the first electrically conductive coatings 5 are electrically connected to the copper layers 2. The second conductive coatings 6 may be formed of the same material as that of the first conductive coatings 5 and are also left to dry at the ambient temperature. Insulating resin coatings 7 are screen printed on the exposed side of the second conductive coatings 6 so as to protect the second conductive coatings from the atmosphere. The protective coatings 7 may be formed of the same material as that of the insulating resin coatings 4 and are dried at 100°–⅛° C. for about 30 minutes.

Thereafter, impedance elements 8 having different resistance values are applied on the exposed side of the insulating resin coatings 4 by screen printing and the impedance elements may be in the form of a solvent-dispersed resin in which a mixture of resin such as epoxy resin or phenolic resin and carbon black or graphite powder are dispersed in a suitable solvent. The resistance values of the impedance elements 8 may be varied within a wide range by suitably selecting the width and length of the impedance elements. Therefore, when a plurality of resistors having different resistance values are applied on one piece of board, the resistors are applied in suitable patterns depending upon the length and width of these elements. In some case, even if the patterns for the impedance elements are predetermined, desired resistances can not be obtained for the impedance elements of different resistance values by only one screen-printing operation. In such a case, the impedance elements are grouped into a plurality of groups with each group comprising impedance elements which have approximately similar resistance values and the different groups of impedance elements are applied one group after another using materials having different resistance values and masks having different patterns, respectively for the different groups at different times. The thus applied impedance elements 8 are dried at 100°–130° C. for 40–50 minutes.

After the application of the impedance elements, the printed board is applied thereon with electrically conductive coatings 9 between both the ends of the impedance elements 8 and the ends of the conductive coatings adjacent to the impedance elements so that the ends of the impedance elements 8 will be positively electrically connected to the adjacent ends of the electrically conductive coatings 5. The conductive coatings 9 are applied by screen printing in the same manner as that in which the electrically conductive coatings 6 are applied and dried at 100°–150° C. for about 30 minutes.

Both the layers of the impedance elements 8 and those of the conductive coatings 9 are simultaneously set and baked. The baking temperature and time interval should be such that the board can withstand the heat treatment without being affected thereby. If desired, the layers of the impedance elements 8 and conductive coatings 9 may be heat aged.

The thus obtained electrical printed resistors and then determined for their resistance values and any resistors the resistances of which are out of predetermined values are adjusted until the resistance values will reach predetermined desired levels. That is, when it has been found that the resistance values are lower than their respectively desired values, the resistance adjustment of the impedance elements is effected by reducing the width of the elements by knife cutting, for example, until they will have their desired resistances. When it has been found that the element 8 has a resistance higher than its desired resistance, the desired resistance can be obtained by applying a silver coating on the one end or the opposite ends of the element so as to reduce the effective length of the element.

Finally, an insulating resin coating 10 is applied over the impedance elements 8 and conductive coatings 9 by printing and then dried so that the impedance elements will be protected from the atmosphere. The protective coating 10 also serves as a mechanical shield which protects the impedance elements 8 and conductive coatings from moisture and external impact. The protective coating 10 should be formed of a suitable material which will not cause the resistance values of the impedance elements to vary. Typically, the protective coating 10 is formed of the same material as that of the resin or base coatings 4. The protective coating 10 may be also eliminated if any protective shell is provided.

According to one specific embodiment of the present invention, the board comprises a laminated paper base in which phenol resin is impregnated. The board is formed on one side with copper layers having desired patterns by etching. The patterns of the copper layers are so selected that they can be suitably employed for wiring electrical condensers, resistors and transistors which are essential components in radio and television sets. The board has been previously formed with through holes 3 which will communicate with the holes of the copper layers 2.

The board is then formed on the opposite side with base coatings having desired different patterns by screen printing with the aid of nylon screen masks of 200 mesh having predetermined lengths and widths. The base coatings are applied on the board side at areas where impedance elements will be applied in the later stage of the process. The base coatings are formed by the use of a solvent dispersed resin comprising a solvent containing epoxy resin dispersed therein and having the poise of about $2\times10^5$. The thus applied base coatings are then left to dry at the ambient temperature for about 30 minutes and then baked at 130° C. for about 30 minutes to set them. It has been found that the thickness of the obtained base coatings is about 30 $\mu$.

Then, to the walls defining selected ones of the through holes in the board there is applied silver coating thereon and the silver employed is a commercially available silver diluted with toluene. The silver base coating material is first deposited at the point of a pin and the pin is inserted through each of the selected holes from one end of the hole so as to deposit the coating material on the wall defining the hole. Thereafter, the pin is withdrawn out of the hole. The thus applied coatings are left to dry at the ambient temperature for about 30 minutes. After the drying of the silver base coatings, second silver coatings are applied across the opposite ends of copper layers and base coatings by screen printing. The material of the second silver costings is of the same type as that of the first-mentioned silver coatings applied on the hole walls. The second silver coatings are dried by heating them at about 130° C. for about 30 minutes. Furthermore, epoxy resin coatings of the same material as that of the base coatings are applied by screen printing over the silver coatings and their adjacent areas and the epoxy resin coatings are left to dry at the ambient temperature for about 30 minutes followed by baking at 130° C. for 30 minutes.

The material employed for the impedance element applying operation is a mixture of xylene resin and acetylene black dispersed in a solvent such as methyl carbitole acetate and having the viscosity of 100,000 poise. The relationship between the blending ratio of the impedance element forming material and the area resistance value of the material when applied in the form of film or coating layer is as follows:

| Area resistance value | Blending ratio (part by weight) | | |
|---|---|---|---|
| | Xylene resin | Solvent (methyl carbitole acetate) | Acetylene black |
| 1 kΩ/sq. | 100 | 100 | 23 |
| 10 kΩ/sq. | 100 | 75 | 10 |

The above-mentioned impedance element forming material is applied on the board at selected areas thereon by screen printing so that the impedance elements formed by the material may have desired different area resistances and the thus obtained impedance elements are dried by heating them at about 130° C. for 45 minutes. It has been found that the thus dried impedance elements have the thickness of about 15 $\mu$. Thereafter, silver coatings are applied across the opposite ends of layers of the impedance elements and the adjacent ends of the conductive coatings extending through the holes in the board and copper layers and the silver coatings are dried by heating them at about 130° C. for 30 minutes.

Both the impedance elements and conductive layers are then baked at 160° C. for about 60 minutes and are left at 100° C. for 15 hours. The thus obtained printed resistor is determined for any deviation from desired patterns with the eye and also determined for its resistance value. And the pattern deviation and resistance values are, if any, adjusted as desired.

Thereafter, an epoxy resin coating is applied over the impedance elements and conductive layers and left to dry at the ambient temperature for 30 minutes followed by backing at about 130° C. for 30 minutes.

While a specific embodiment of the invention has been shown and described in detail it will be understood that the same is for illustration purpose only and is not to be taken as a definition of the invention and that various modifications and changes on the same will easily occur to those skilled in the art without departing from the scope of the invention as defined in the appended claims. For example, the sequence in which the base coating applying step and the through hole conductor applying step are carried out may be reversed and the sequence in which the through hole conductor applying step, impedance element printing step and the connecting conductor coating step are carried out may be also varied in various ways. Such modifications are also within the scope of the invention as claimed in the appended claims.

What is claimed is:

1. A process for producing electrical resistors employing a printed circuit board which comprises the steps of preparing copper patterns on one side of said board by etching copper thereon so as to form copper layers, forming several pairs of through holes in said board at points where the copper layers are to be electrically connected to electrical devices, applying a pair of electrical conductors one in each of a pair of said holes, and printing impedance material on a second side of said board so as to form layers of said impedance material across each pair of said electrical conductors.

2. A process as set forth in claim 1, in which said electrical conductors comprise mixture of resin and conductive powder and are applied on the walls defining said through holes.

3. A process as set forth in claim 1, in which said electrical conductors comprise solid conductors which are pressed in said through holes.

4. A process as set forth in claim 1, in which prior to applying said impedance material on said second side of the board-insulating resin coatings are applied on the second board side by printing at areas where said impedance material is to be applied.

5. A process as set forth in claim 1, in which said process further comprises the step of applying a conductive coating across one exposed end of each of said electrical conductors applied in said through holes and the mating end of each of said copper layers.

6. A process as set forth in claim 1, in which said process further comprises the step of applying a conductive coating across one exposed end of each of said electrical conductors applied in said through holes and the adjacent end of each of said layers of impedance material.

7. A process as set forth in claim 1, in which said process further comprises the step of applying a common insulating resin coating by printing over and on said layers of impedance material.

8. A process as set forth in claim 1, in which said process further comprises the steps of applying a conductive coating across one exposed end of each of said electrical conductors applied in said through holes and the adjacent one end of each of said copper layers, and applying insulating resin coatings by printing on and in the vicinity of said conductive coatings.

9. A process as set forth in claim 1, in which said process further comprises the steps of applying a conductive coating across one exposed end of each of said electrical conductors applied in said through holes and the adjacent end of each of said layers of impedance material and applying a common insulating resin coating by printing over said layers of impedance material and said conductive coatings.

10. A process for producing an electrical resistor employing a circuit board which comprises the steps of preparing conductor layers on one side of the board, forming a through hole in the board in one conductor layer, forming another through hole in the board in another conductor layer, printing impedance material on a second side of the board so as to form a layer of impedance material between said two through holes, and applying electrically conductive means in each of said through holes to interconnect each end portion of said layer of impedance material with a conductor layer.

11. A process as set forth in claim 10, in which prior to applying said impedance material on said second side of the board-insulating coatings are applied on the second board side at areas where said impedance material is to be applied.

12. A process as set forth in claim 10, in which said process further comprises the step of applying a conductive coating across one exposed end of each of said electrically conductive means and the mating end of each of said conductor layers.

13. A process as set forth in claim 10, in which said process further comprises the step of applying a conductive coating across one exposed end of each of said electrically conductive means and the adjacent end of said layer of impedance material

14. A process as set forth in claim 10, in which said process further comprises the steps of applying a conductive coating across one exposed end of said electrically conductive means and the adjacent end of said layer of impedance material, and applying an insulating coating over said layers of impedance material and electrically conductive means.

15. A process as set forth in claim 10, in which said process further comprises the steps of applying a conductive coating across one exposed end of said electrically conductive means and the mating end of each of said conductor layers, and applying an insulating coating over said conductor layers and electrically conductive means.

16. A process as set forth in claim 10, in which said process further comprises applying said electrically conductive means in one step of applying it in said through holes and another step of applying it to join the electrically conductive means in a through hole and the mating end of each of said conductor layers.

17. A process as set forth in claim 10, in which said process further comprises applying said electrically conductive means in one step of applying it in said through holes and another step of applying it to join the electrically conductive means in a through hole and the adjacent end of said layer of impedance material.

* * * * *